(12) United States Patent
Jung et al.

(10) Patent No.: US 6,999,375 B2
(45) Date of Patent: Feb. 14, 2006

(54) SYNCHRONOUS SEMICONDUCTOR DEVICE AND METHOD OF PREVENTING COUPLING BETWEEN DATA BUSES

(75) Inventors: Jin-kyoung Jung, Suwon (KR); Kyu-hyoun Kim, Suwon (KR)

(73) Assignee: Samsung Electronics, Co., Ltd., (KR)

( * ) Notice: Subject to any disclaimer, the term of this patent is extended or adjusted under 35 U.S.C. 154(b) by 214 days.

(21) Appl. No.: 10/672,461

(22) Filed: Sep. 26, 2003

(65) Prior Publication Data
US 2004/0063271 A1    Apr. 1, 2004

(30) Foreign Application Priority Data
Sep. 30, 2002    (KR)    ............... 10-2002-0059412

(51) Int. Cl.
*G11C 8/00*    (2006.01)
(52) U.S. Cl. ......................... 365/233; 365/63
(58) Field of Classification Search ............. 365/233, 365/63
See application file for complete search history.

(56) References Cited

U.S. PATENT DOCUMENTS

| | | | |
|---|---|---|---|
| 6,189,133 B1 | 2/2001 | Durham et al. | 716/12 |
| 6,388,277 B1 | 5/2002 | Kobayashi et al. | 257/207 |
| 6,522,599 B1 * | 2/2003 | Ooishi et al. | 365/233 |
| 6,574,163 B1 * | 6/2003 | Maeda | 365/233 |
| 6,778,454 B1 * | 8/2004 | Duh et al. | 365/221 |

FOREIGN PATENT DOCUMENTS

JP    2000-29923    1/2000

* cited by examiner

*Primary Examiner*—Tuan T. Nguyen
(74) *Attorney, Agent, or Firm*—Mills and Onello, LLP

(57) ABSTRACT

A synchronous semiconductor device and a method for preventing coupling between data buses. The synchronous semiconductor device supports at least two kinds of bit configuration modes and includes a first data bus and a second data bus. The first data bus is used to transmit data in a first bit configuration mode and used as a shielding line in a configuration mode other than the first bit configuration mode. The second data bus is used to transmit data in the first bit configuration mode and a second bit configuration mode and used as a shielding line in a configuration mode other than the first bit configuration mode and the second bit configuration mode. The first data bus and the second data bus are arranged alternately. In using the device and method, it is possible to prevent coupling between the data buses without additional shielding lines by using the same kind of data bus, which is not used to transmit data, as the shielding line.

9 Claims, 2 Drawing Sheets

I: X16 only
II: X16, X8 only
III: X16, X8, X4

I: DDR only
II: DDR, SDR

SYNCHRONOUS SEMICONDUCTOR DEVICE AND METHOD OF PREVENTING COUPLING BETWEEN DATA BUSES

BACKGROUND OF THE INVENTION

This application claims the priority of Korean Patent Application No. 2002-59412, filed Sep. 30, 2002, in the Korean Intellectual Property Office, the contents of which are incorporated herein in their entirety by reference.

1. Field of the Invention

The present invention relates to a semiconductor memory device, and more particularly, to shielding a data line to prevent coupling in a synchronous dynamic random access memory (SDRAM).

2. Description of the Related Art

As the operating speed and the integration density of the SDRAM increase, the number of data input/output pins increases. An increase in the amount of data input or output at any given time requires an increase in the number of data buses for transmitting the data.

Increases in the number of data buses and noise due to a rapid operating speed increase the interference between data buses or between a data bus and other signal lines. Consequently, it becomes important to minimize the interference in the SDRAM.

In a conventional SDRAM, lines of a supply voltage and a ground voltage are placed on both sides of the data bus, and thus the data bus is shielded so as to prevent abnormal operations due to the coupling between the data buses.

FIG. 1 is a view illustrating shielding of a data bus in an SDRAM according to prior art. Referring to FIG. 1, a voltage line 120, which is connected with a supply voltage or a ground voltage VSS, is placed to separate data bus 110 which is to be shielded. That is, the voltage line 120 is used as a shielding line to prevent coupling between data buses 110 that are adjacent to each other.

As a bit configuration of the SDRAM becomes more complicated, the number of data bus lines increases, and thus the area of a layout of the SDRAM greatly increases. The bit configuration indicates a number of data bits which can be input or output to or from the SDRAM at a time. For example, the bit configuration of the SDRAM which inputs or outputs 4 bits of data is 4, and the bit configuration of the SDRAM which inputs or outputs 8 bits of data is 8. In general, the bit configuration is represented as X4, X8, X16, or the like.

The SDRAM is usually designed to operate in various bit configuration modes, and the bit configuration mode can be reset to a certain desired bit configuration after manufacture of the SDRAM is completed. In addition, the SDRAM can operate in a single data rate (SDR) mode where the SDRAM outputs a bit of data per pin during one clock cycle, or in a double data rate (DDR) mode where the SDRAM outputs two bits of data per pin during one clock cycle.

As for the DDR SDRAM, if the bit configuration is X4, eight data bus lines are employed, and if the bit configuration is X16, 32 data bus lines are employed.

Thus, when the data bus is shielded as shown in FIG. 1, eight data buses and nine power lines are required in an X4 bit configuration, and 32 data bus lines and 33 power supply lines are required in an X16 bit configuration. Consequently, the area of the layout of the SDRAM increases, which causes the increase in size of an SDRAM chip.

SUMMARY OF THE INVENTION

It is an object of the present invention to provide a synchronous semiconductor device which prevents coupling between data buses by shielding the data bus without increasing the area of a layout.

It is another object of the present invention to provide a method of shielding a data bus of a synchronous semiconductor device which prevents coupling between data buses by shielding the data bus without increasing the area of a layout.

According to an aspect of the present invention, there is provided a synchronous semiconductor device supporting at least two kinds of bit configuration modes. The synchronous semiconductor device includes a first data bus which is used to transmit data in a first bit configuration mode and not used to transmit data in a configuration mode other than the first bit configuration mode and a second data bus which is used to transmit data in the first bit configuration mode and a second configuration mode, is not used to transmit data in a configuration mode other than the first bit configuration mode and the second configuration mode, and is arranged to be parallel with the first data bus, wherein the first data bus and the second data bus are arranged alternately.

Preferably, the synchronous semiconductor device further comprises a third data bus which is used to transmit data in the first bit configuration mode, the second bit configuration mode, and a third bit configuration mode and is arranged to be parallel with the first data bus and the second data bus, wherein every other second data bus is replaced with the third data bus.

In one embodiment, the third bit configuration is Xn (n denotes a natural number more than 2), the second bit configuration is X2n, and the first bit configuration is X4n.

Preferably, the first data bus is electrically connected to a supply voltage in the second bit configuration mode and the third bit configuration mode, and the second data bus is electrically connected to a supply voltage in the third bit configuration mode.

In one embodiment, the supply voltage is a ground voltage.

In one embodiment, the first data bus, the second data bus, and the third data bus are arranged between a bit line sense amplifier and an output buffer or between the bit line sense amplifier and an input buffer.

According to another aspect of the present invention, there is provided a synchronous semiconductor device which supports both a single data rate mode and a double data rate mode. The synchronous semiconductor device includes a first data bus which is used to transmit data in the double data rate mode and not used to transmit data in the single data rate mode, and a second data bus which is used to transmit data in the single data rate mode and in the double data rate mode and is arranged to be parallel with the first data bus. The first data bus and the second data bus are arranged alternately.

Preferably, the first data bus is electrically connected to a supply voltage or a ground voltage in the single data rate mode. The first and second data buses can be arranged between a bit line sense amplifier and an output buffer or between the bit line sense amplifier and an input buffer.

According to another aspect of the present invention, there is provided a method of shielding data buses in a synchronous semiconductor device which supports at least modes including a first mode and a second mode and uses a various number of data buses according to the mode. The method includes classifying the data bus that is used to transmit data only in the first mode as a first data bus and classifying the data bus that is used to transmit data only in the second mode as a second data bus. The first and second data buses are arranged alternately. The first data bus is connected to a supply voltage or a ground voltage in the second mode.

Preferably, the first mode is a double data rate mode, and the second mode is a single data rate mode.

Preferably, the first mode is a first bit configuration mode, and the second mode is a second configuration mode.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
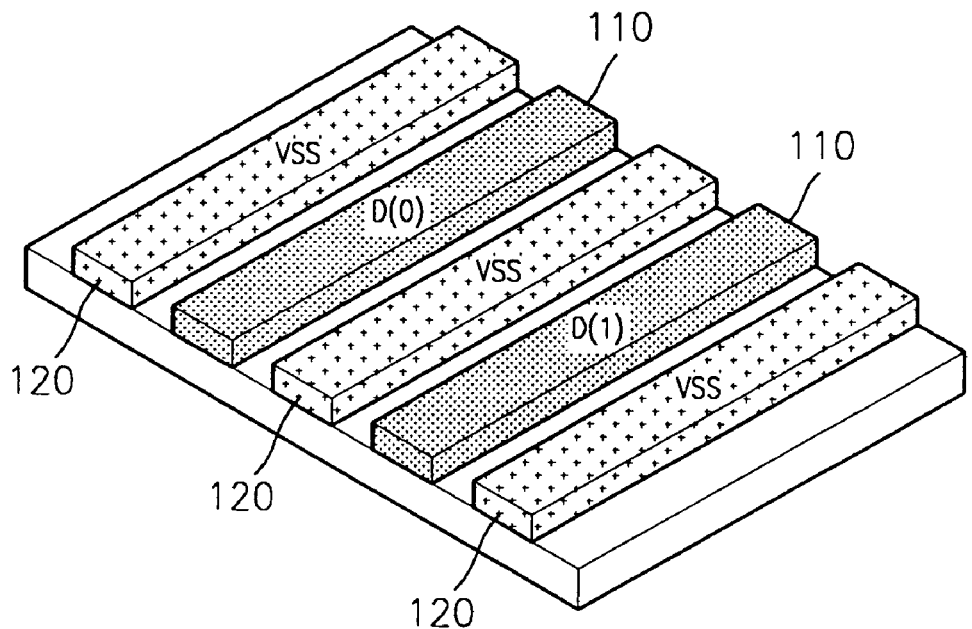
FIG. 1 is a view illustrating shielding of a data bus in an SDRAM according to prior art.
Figure 2:
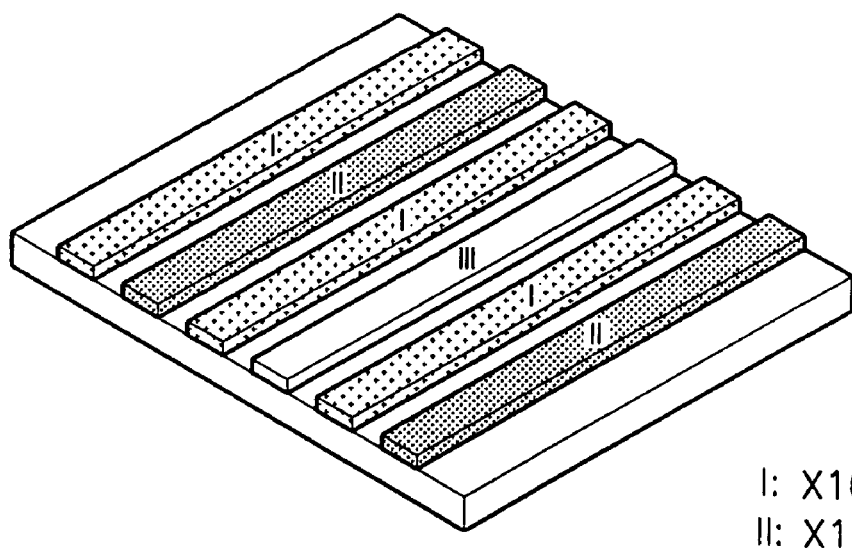
FIG. 2 is a view illustrating shielding of a data bus in an SDRAM according to one embodiment of the present invention.

FIG. 2 is a view illustrating shielding of a data bus in an SDRAM according to one embodiment of the present invention. The SDRAM according to one embodiment of the present invention supports three kinds of bit configurations and includes a first data bus I, a second data bus II, and a third data bus III.

The first data bus I, the second data bus II, and the third data bus III are signal lines which are of the same type and are used to transmit data input or output from or to a data input/output pin (not shown).

The first data bus I is used to transmit data in a first bit configuration mode but is not used to transmit data in modes other than the first bit configuration mode. That is, the first data bus I is used to transmit data only in the first bit configuration mode.

The second data bus II is used to transmit data in the first bit configuration mode and in a second configuration mode but is not used to transmit data in modes other than the first and second bit configuration modes. That is, the second data bus II is used to transmit data only in the first and second configuration modes.

The third data bus III is used to transmit data in the first configuration mode, the second configuration mode, and a third configuration mode.

Each of the first data bus I, the second data bus II, and the third data bus III denotes a group of a plurality of bus lines rather one bus line.

The first data bus I, the second data bus II, and the third data bus III are arranged alternately, that is, they are arranged such that the same groups of data buses are not adjacent to each other. That is, the first data bus I is arranged so as not to be adjacent to the first data bus I, the second data bus II is arranged so as not to be adjacent to the second data bus II and the third data bus III is arranged so as not to be adjacent to the third data bus m. In FIG. 2, the data buses are sequentially disposed to be parallel with one another in the following order: the first data bus I, the second data bus II, the first data bus I, the third data bus m, the first data bus I, and the second data bus II.

Such a structure makes it possible to use a data bus, which is not used in a specific bit configuration mode, to shield other groups of data buses.

For example, in the third bit configuration mode, only the third data bus III is used to transmit data, and the first and second data buses I and II are not used to transmit data. Here, the first and the second data buses I and II are connected to a supply voltage or a ground voltage VSS and are used in shielding the third data bus III.

In the second bit configuration mode, only the second data bus II and the third data bus III are used to transmit data, and the first data bus I is not used to transmit data. Here, the first data bus I is connected to the supply voltage or the ground voltage VSS and is used to shield the second and the third data buses II and III.

In this embodiment, the first bit configuration is X16, the second bit configuration is X8, and the third bit configuration is X4. However, various changes in the bit configuration can be made. In addition, three kinds of bit configuration modes are supported in this embodiment, however, a number of bit configuration modes can be used.

As described above, it is possible to prevent coupling between data buses without having additional shielding lines by using the data bus that is not used to transmit data in a specific bit configuration mode as the shielding line. In particular, when the same kind of signal lines, such as a data bus, are arranged, it is possible to shield the data bus without using other kinds of signal lines.

Figure 3:
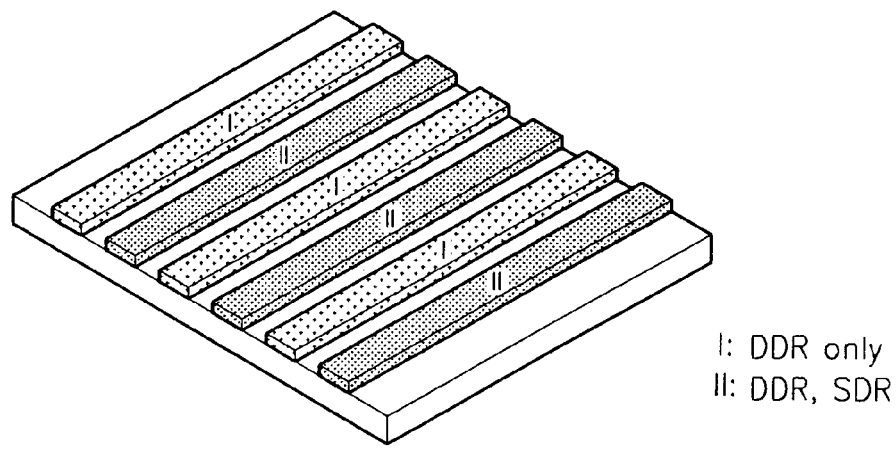
FIG. 3 is a view illustrating shielding of a data bus in an SDRAM according to another embodiment of the present invention.

FIG. 3 is a view illustrating shielding of a data bus in an SDRAM according to another embodiment of the present invention. The SDRAM according to another embodiment of the present invention supports both the SDR mode and the DDR mode and a first data bus I and a second data bus II.

The first data bus I and the second data bus II are signal lines which are of the same kind and are used to transmit data input or output to or from a data input/output pin (not shown).

The first data bus I is used to transmit data in the DDR mode but is not used to transmit data in the SDR mode. The second data bus II is used to transmit data in both the DDR mode and the SDR mode.

The first data bus I and the second data bus II are arranged alternately such that the same group of data buses are not adjacent to each other. That is, the first data bus I is arranged so as not to be adjacent to the first data bus I, and the second data bus II is arranged so as not to be adjacent to the second data bus II.

Consequently, the first data bus I, which is not used to transmit data in the SDR mode, is used to shield other groups of data buses.

That is, in the SDR mode, only the second data bus II is used to transmit data, and the first data bus I is not used to transmit data. Here, the first data bus I is connected to a supply voltage or a ground voltage VSS and is used to shield the first data bus II.

Figure 4:
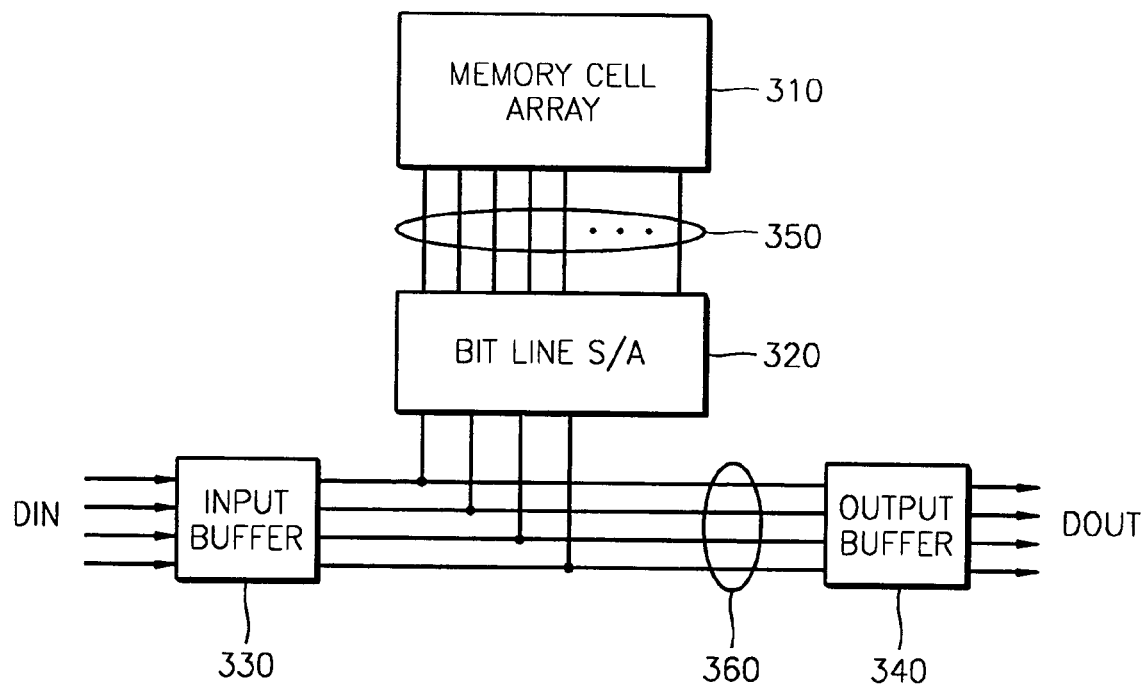
FIG. 4 is a block diagram of the internal structure of an SDRAM having the data bus shown in FIG. 3 or FIG. 4.

FIG. 4 is a block diagram of an internal structure of an SDRAM having the data bus shown in FIG. 3 or FIG. 4. Referring to FIG. 4, the SDRAM includes a memory cell array 310, a bit line sense amplifier 320, an input buffer 330, an output buffer 340, a plurality of bit lines 350, and a data bus 360.

The data bus 360 is arranged by the method of shielding a data bus according to the present invention, as shown in FIG. 2 or 3.

Externally input data DIN is input through the input buffer 330, then runs through the data bus 360, the bit line sense amplifier 320, and the bit lines 350 to a specific memory cell of the memory cell array 310 to be stored in the specific memory cell. Data stored in the memory cell is sent via the data bit lines 350, the bit line sense amplifier 320, and the data bus 360 to be output from the output buffer 340 as external data DOUT.

A method of shielding a data bus according to the present invention is applied to the data bus 360 which is used to transmit data between the bit line sense amplifier 320 and the output buffer 340, or between the bit line sense amplifier 330, and the input buffer 330.

Though not shown in FIG. 4, an amplifier or a driver may be included in a path between the bit line sense amplifier 320 and the output buffer 340, and a driver and a multiplexer may be included in a path between the bit line sense amplifier 320 and the input buffer 330. The method of shielding a data bus according to the present invention can also be applied between the bit line sense amplifier 320 and the input buffer 340 and/or between the bit line sense amplifier 320 and the input buffer 330, partially or entirely.

According to the present invention, it is possible to prevent coupling between data buses without additional shielding lines by using the same kind of data bus, which is not used to transmit data, as the shielding line.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A synchronous semiconductor device supporting at least two kinds of bit configuration modes, the synchronous semiconductor device comprising:
    a first data bus which is used to transmit data in a first bit configuration mode and is not used to transmit data in a configuration mode other than the first bit configuration mode; and
    a second data bus which is used to transmit data in the first bit configuration mode and a second configuration mode, is not used to transmit data in a configuration mode other than the first bit configuration mode and the second configuration mode, and is arranged to be parallel with the first data bus,
    wherein the first data bus and the second data bus are arranged alternately.

2. The synchronous semiconductor device of claim 1, wherein the synchronous semiconductor device further comprises a third data bus which is used to transmit data in the first bit configuration mode, the second bit configuration mode, and a third bit configuration mode and is arranged to be parallel with the first data bus and the second data bus, wherein every other second data bus is replaced with the third data bus.

3. The synchronous semiconductor device of claim 2, wherein the third bit configuration is Xn (n denotes a natural number more than 2), the second bit configuration is X2n, and the first bit configuration is X4n.

4. The synchronous semiconductor device of claim 2, wherein the first data bus is electrically connected to a supply voltage in the second bit configuration mode and the third bit configuration mode, and the second data bus is electrically connected to a supply voltage in the third bit configuration mode.

5. The synchronous semiconductor device of claim 4, wherein the supply voltage is a ground voltage.

6. The synchronous semiconductor device of claim 2, wherein the first data bus, the second data bus, and the third data bus are arranged between a bit line sense amplifier and an output buffer or between the bit line sense amplifier and an input buffer.

7. A synchronous semiconductor device which supports both a single data rate mode and a double data rate mode, the synchronous semiconductor device comprising:
    a first data bus which is used to transmit data in the double data rate mode and is not used to transmit data in the single data rate mode; and
    a second data bus which is used to transmit data in the single data rate mode and in the double data rate mode and is arranged to be parallel with the first data bus,
    wherein the first data bus and the second data bus are arranged alternately.

8. The synchronous semiconductor device of claim 7, wherein the first data bus is electrically connected to a supply voltage or a ground voltage in the single data rate mode.

9. The synchronous semiconductor device of claim 7, wherein the first data bus and the second data bus are arranged between a bit line sense amplifier and an output buffer or between the bit line sense amplifier and an input buffer.

* * * * *